(12) United States Patent
Liao et al.

(10) Patent No.: US 9,992,910 B2
(45) Date of Patent: Jun. 5, 2018

(54) LIQUID SUPPLY MECHANISM AND LIQUID COOLING SYSTEM

(71) Applicant: COOLER MASTER CO., LTD., New Taipei (TW)

(72) Inventors: Pen-Hung Liao, New Taipei (TW); Shih-Wei Huang, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 199 days.

(21) Appl. No.: 14/736,285

(22) Filed: Jun. 11, 2015

(65) Prior Publication Data

US 2016/0366788 A1 Dec. 15, 2016

(51) Int. Cl.
*H05K 7/20* (2006.01)
*B67D 7/36* (2010.01)
(Continued)

(52) U.S. Cl.
CPC ........... *H05K 7/20272* (2013.01); *B67D 7/36* (2013.01); *F04B 11/0008* (2013.01); *F04B 9/02* (2013.01); *F04B 11/0033* (2013.01); *F04B 23/02* (2013.01)

(58) Field of Classification Search
CPC ........ F04B 11/008; F04B 17/03; F04B 17/04; F04B 17/042; F04B 17/044; F04B 23/02; F04B 23/025; F04B 23/028; F04B 35/045; F04B 9/02; F04C 2240/804; H05K 7/20272; H05K 1/0203; H05K 1/0204;
(Continued)

(56) References Cited

U.S. PATENT DOCUMENTS 2,943,642 A 7/1960 Westcott, Jr.
3,559,727 A 2/1971 Hill
(Continued)

FOREIGN PATENT DOCUMENTS

CN 2772025 Y 4/2006
CN 204187069 U 3/2015
(Continued)

OTHER PUBLICATIONS

Pen-Hung Liao et al., Title: Liquid Supply Mechanism and Liquid Cooling System, pending U.S. Appl. No. 14/736,246, filed Jun. 10, 2015.
(Continued)

*Primary Examiner* — Bryan Lettman
*Assistant Examiner* — Charles W Nichols
(74) *Attorney, Agent, or Firm* — Winston Hsu

(57) ABSTRACT

A liquid supply mechanism includes a lower cover, an upper cover, a plunger, at least one resilient member and at least one damping member. The lower cover has a liquid outlet and the upper cover is connected to the lower cover. A chamber is formed between the lower cover and the upper cover. The chamber communicates with the liquid outlet and contains a cooling liquid. The upper cover has an axial hole. The plunger is movably disposed in the chamber. The plunger has an axial rod and the axial rod is inserted into the axial hole. The resilient member is disposed in the chamber. Opposite ends of the resilient member abut against the upper cover and the plunger. The damping member is disposed on the axial rod and abuts against an inner wall of the axial hole.

10 Claims, 7 Drawing Sheets

(51) Int. Cl.
*F04B 11/00* (2006.01)
*F04B 9/02* (2006.01)
*F04B 23/02* (2006.01)

(58) Field of Classification Search
CPC .. H05K 1/0206; H05K 1/0207; H05K 1/0209; B67D 7/362; F28F 9/0231; F01P 11/029; F28D 2021/0228; F28D 2021/0029; H01L 23/40; H01L 23/46; H01L 23/473; H01L 23/4735; H01L 23/4336; H01L 23/4332; H01L 23/4338; F15B 15/1461; F16J 9/00; F16J 15/16; F16J 15/32
USPC .................. 92/168; 165/80.2, 80.41, 104.32; 361/600
See application file for complete search history.

(56) References Cited

U.S. PATENT DOCUMENTS

| | | | |
|---|---|---|---|
| 3,907,001 A * | 9/1975 | Vanderlaan | F04B 9/125 137/116.5 |
| 4,450,870 A * | 5/1984 | Vick | F15B 1/04 138/31 |
| 5,172,657 A | 12/1992 | Sausner | |
| 5,176,112 A * | 1/1993 | Sausner | F01P 3/2271 123/41.21 |
| 5,324,886 A | 6/1994 | Nakatake | |
| 5,976,226 A | 11/1999 | Bastian | |
| 6,349,554 B2 | 2/2002 | Patel | |
| 6,871,670 B2 | 3/2005 | Suzuki | |
| 6,973,116 B2 | 12/2005 | Popov | |
| 2005/0173097 A1 | 8/2005 | Kitajima | |
| 2011/0253346 A1 | 10/2011 | Bartosz | |
| 2012/0326495 A1 | 12/2012 | Trageser | |
| 2013/0074967 A1 | 3/2013 | Marin | |
| 2013/0139903 A1 | 6/2013 | Haas | |
| 2016/0115676 A1 | 4/2016 | Chen | |

FOREIGN PATENT DOCUMENTS

| | | |
|---|---|---|
| DE | 94429 | 2/1899 |
| DE | 1 169 738 | 5/1964 |
| DE | 1 188 247 | 3/1965 |
| DE | 103 08 982 B3 | 3/2004 |
| DE | 10 2007 036 854 A1 | 2/2008 |
| DE | 10 2011 120 895 A1 | 4/2012 |
| EP | 2 484 919 A2 | 8/2012 |
| FR | 1.181.593 | 6/1959 |
| JP | 2009-241750 A | 10/2009 |
| TW | 201013376 | 4/2010 |
| TW | 201120392 A1 | 6/2011 |
| TW | M511547 U | 11/2015 |
| WO | 2006087031 A1 | 8/2006 |

OTHER PUBLICATIONS

Pen-Hung Liao et al., Title: Liquid Supply Mechanism and Liquid Cooling System, pending U.S. Appl. No. 14/736,273, filed Jun. 11, 2015.

Hsin-Hung Chen et al., Title: Liquid Supply Device and Liquid Cooling System, pending U.S. Appl. No. 15/147,918, filed May 6, 2016.

* cited by examiner

LIQUID SUPPLY MECHANISM AND LIQUID COOLING SYSTEM

BACKGROUND OF THE INVENTION

1. Field of the Invention

The invention relates to a liquid supply mechanism and a liquid cooling system and, more particularly, to a liquid supply mechanism capable of preventing a liquid cooling system from generating high hydraulic pressure while supplying a cooling liquid to the liquid cooling system.

2. Description of the Prior Art

In general, a liquid cooling system essentially consists of a liquid cooling head, a radiator, a pump and a liquid storage box connected through a plurality of tubes. When the liquid cooling system is dissipating heat from an electronic component, the pump transports a cooling liquid to the liquid cooling head, the cooling liquid absorbs the heat generated by the electronic component, and then the radiator cools the cooling liquid. After the liquid cooling system is used for a long time, the cooling liquid will reduce due to vaporization, such that the cooling liquid may be insufficient. If the user does not supply the cooling liquid in time, the liquid cooling system may be damaged due to insufficient cooling liquid.

SUMMARY OF THE INVENTION

The invention provides a liquid supply mechanism and a liquid cooling system equipped with the liquid supply mechanism, so as to solve the aforesaid problems.

According to an embodiment of the invention, a liquid supply mechanism comprises a lower cover, an upper cover, a plunger, at least one resilient member and at least one damping member. The lower cover has a liquid outlet and the upper cover is connected to the lower cover. A chamber is formed between the lower cover and the upper cover. The chamber communicates with the liquid outlet. The upper cover has an axial hole. The plunger is movably disposed in the chamber. The plunger has an axial rod and the axial rod is inserted into the axial hole. The resilient member is disposed in the chamber. Opposite ends of the resilient member abut against the upper cover and the plunger. The damping member is disposed on the axial rod and abuts against an inner wall of the axial hole.

According to another embodiment of the invention, a liquid cooling system comprises a liquid cooling head, a radiator, a pump, a liquid storage box, a plurality of tubes and a liquid supply mechanism. The tubes are connected between the liquid cooling head, the radiator, the pump and the liquid storage box. The liquid supply mechanism is selectively connected to one of the liquid cooling head, the radiator, the pump, the liquid storage box and the tubes. The liquid supply mechanism comprises a lower cover, an upper cover, a plunger, at least one resilient member and at least one damping member. The lower cover has a liquid outlet and the upper cover is connected to the lower cover. A chamber is formed between the lower cover and the upper cover. The chamber communicates with the liquid outlet. The upper cover has an axial hole. The plunger is movably disposed in the chamber. The plunger has an axial rod and the axial rod is inserted into the axial hole. The resilient member is disposed in the chamber. Opposite ends of the resilient member abut against the upper cover and the plunger. The damping member is disposed on the axial rod and abuts against an inner wall of the axial hole.

As mentioned in the above, the liquid supply mechanism of the invention is selectively connected to one of the liquid cooling head, the radiator, the pump, the liquid storage box and the tubes. When the cooling liquid reduces and then the hydraulic pressure of the liquid cooling system reduces, the resilient member of the liquid supply mechanism will push the plunger to move, so as to inject the cooling liquid from the chamber into the liquid cooling system. In other words, the liquid supply mechanism of the invention can supply the cooling liquid to the liquid cooling system automatically when the cooling liquid is insufficient, so as to prevent the liquid cooling system from being damaged due to insufficient cooling liquid. Furthermore, the damping member is disposed on the axial rod of the plunger and abuts against the inner wall of the axial hole. When the plunger is moving, a damping effect is generated between the damping member and the inner wall of the axial hole, so as to reduce the push force generated by the resilient member for the plunger. Accordingly, the invention can prevent the liquid cooling system from generating high hydraulic pressure while supplying the cooling liquid to the liquid cooling system, such that the heat dissipating efficiency of the liquid cooling system will not be affected.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
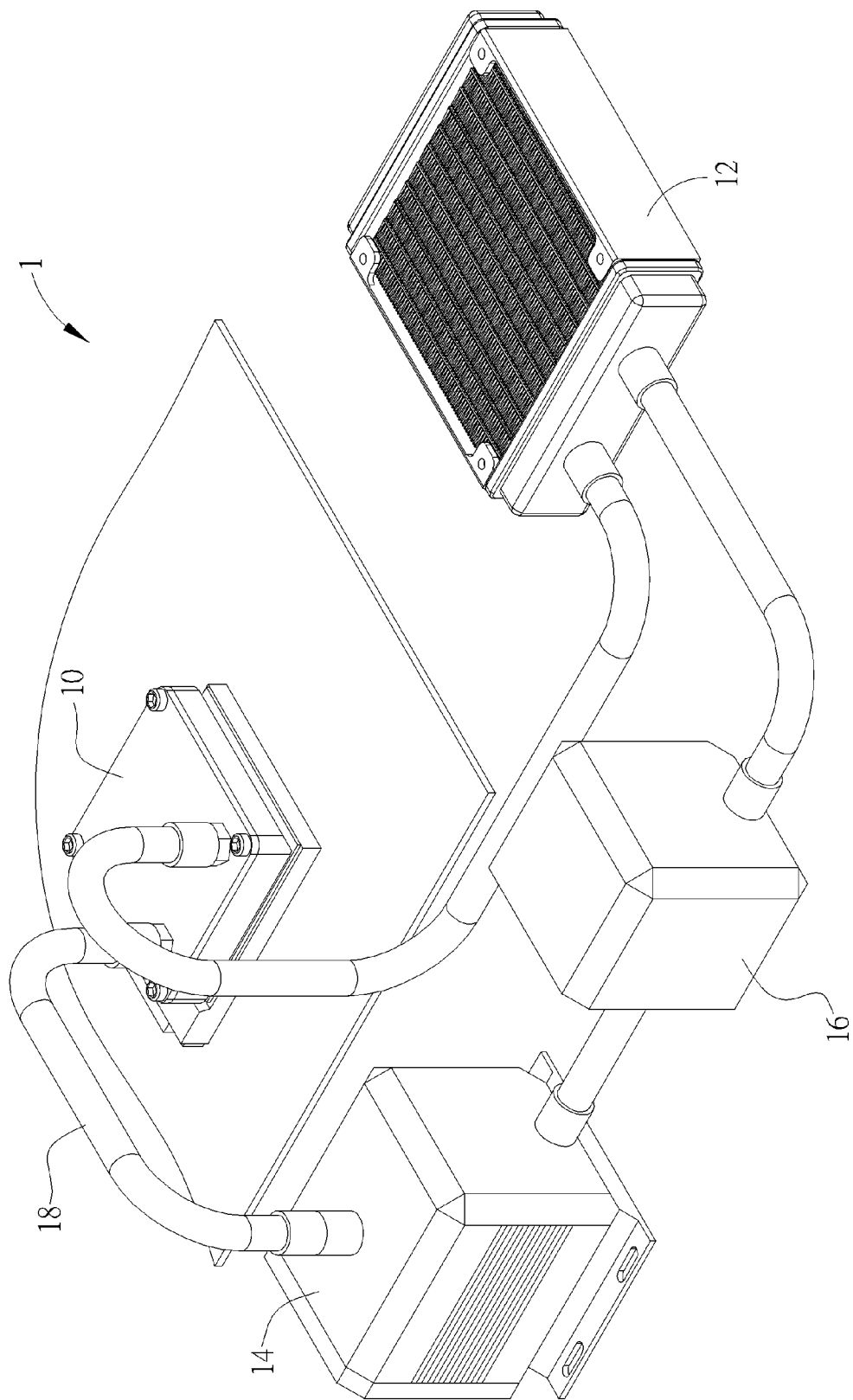
FIG. 1 is a schematic view illustrating a liquid cooling system according to an embodiment of the invention.
Figure 2:
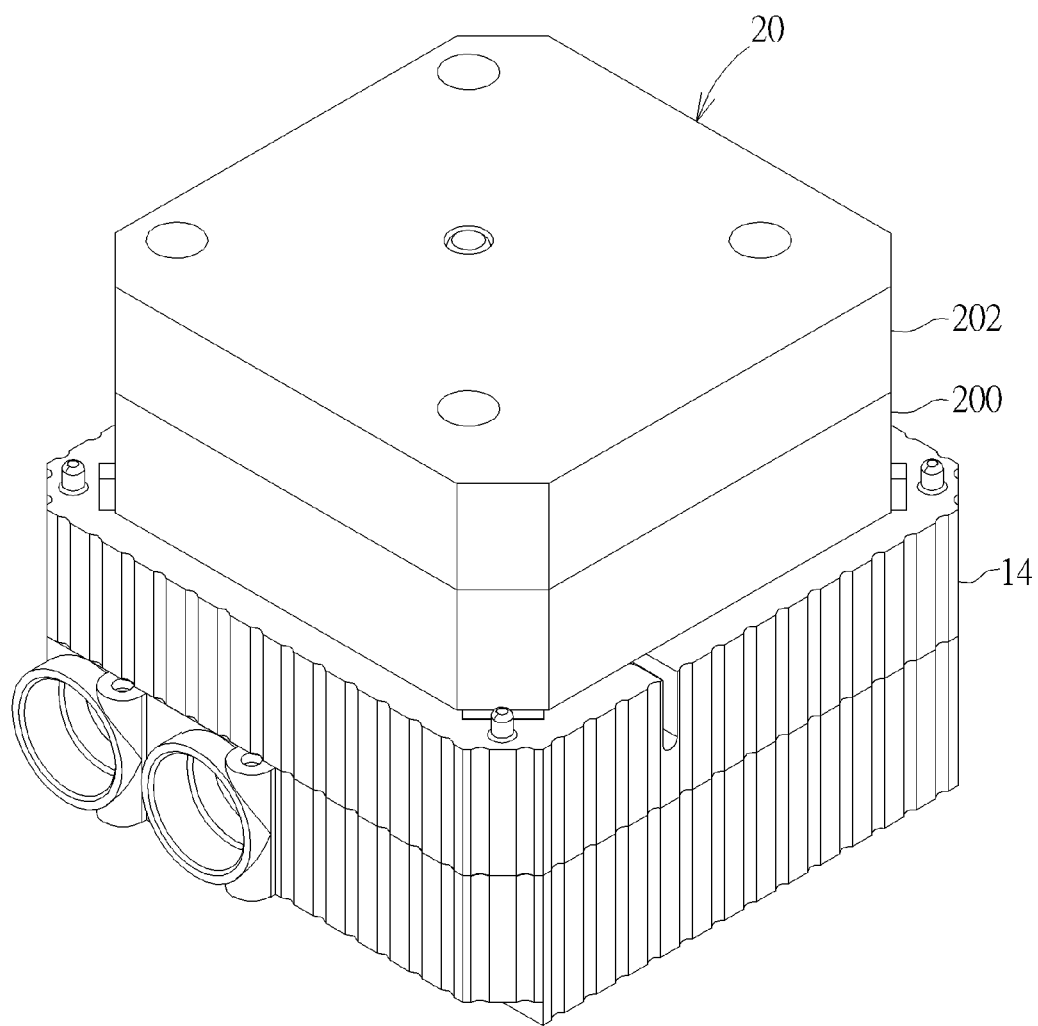
FIG. 2 is a schematic view illustrating a liquid supply mechanism connected to a pump 14.
Figure 3:
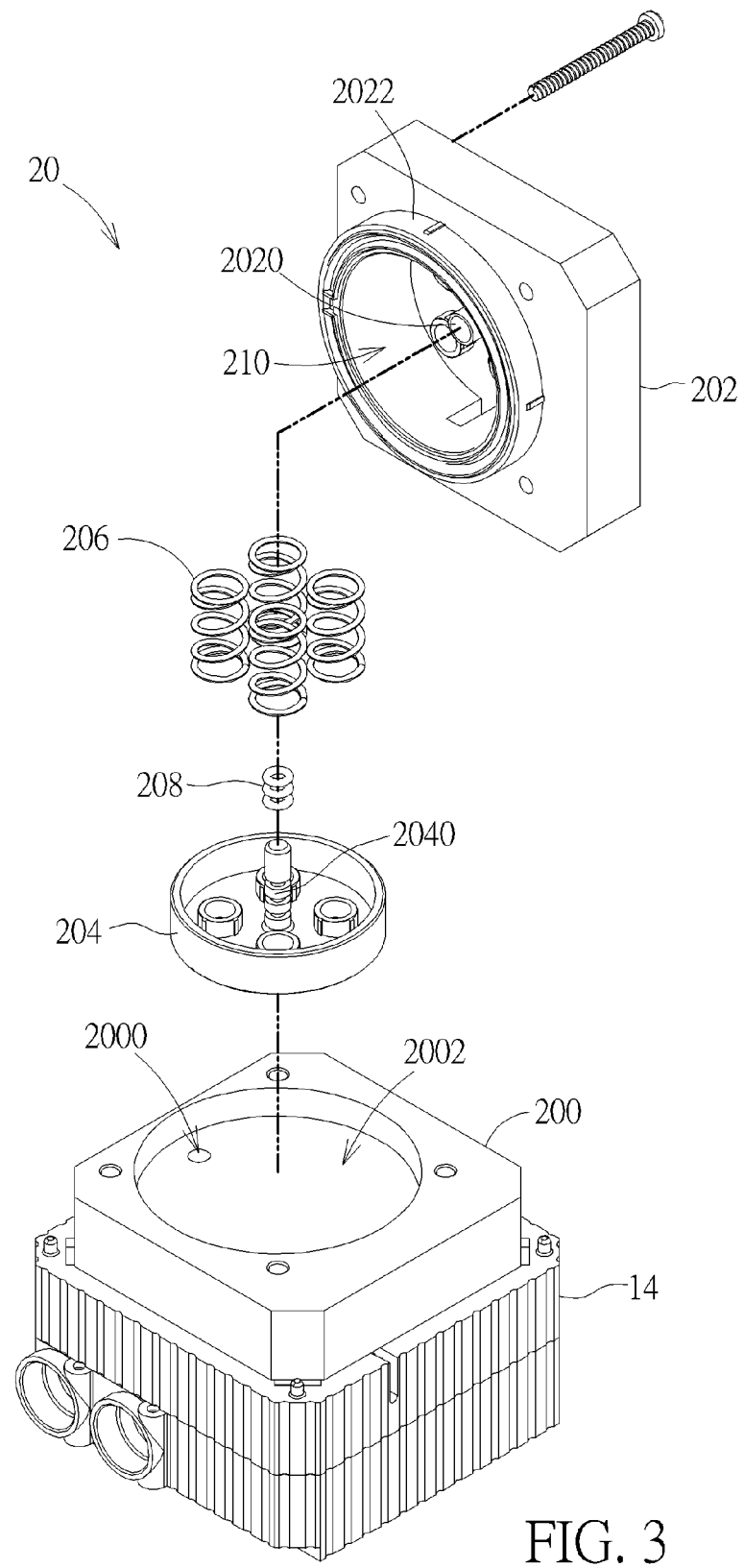
FIG. 3 is an exploded view illustrating the liquid supply mechanism.
Figure 4:
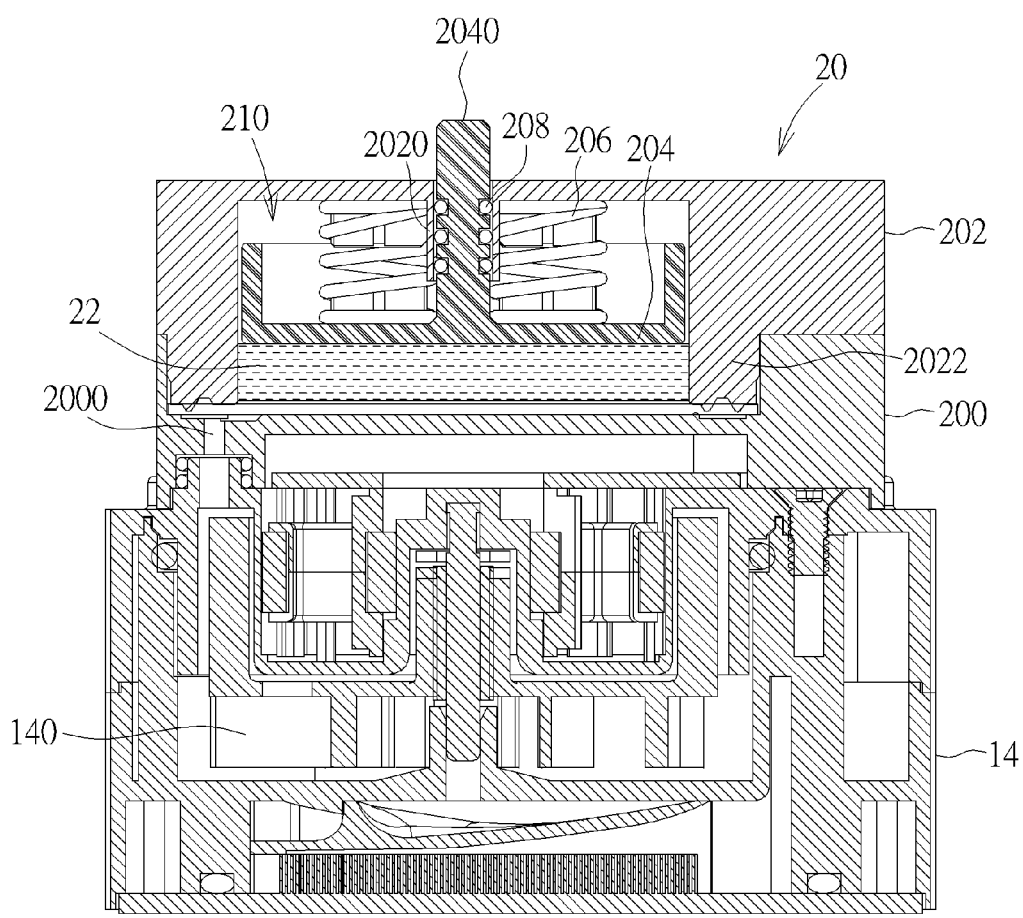
FIG. 4 is a cross-sectional view illustrating the liquid supply mechanism and the pump.
Figure 5:
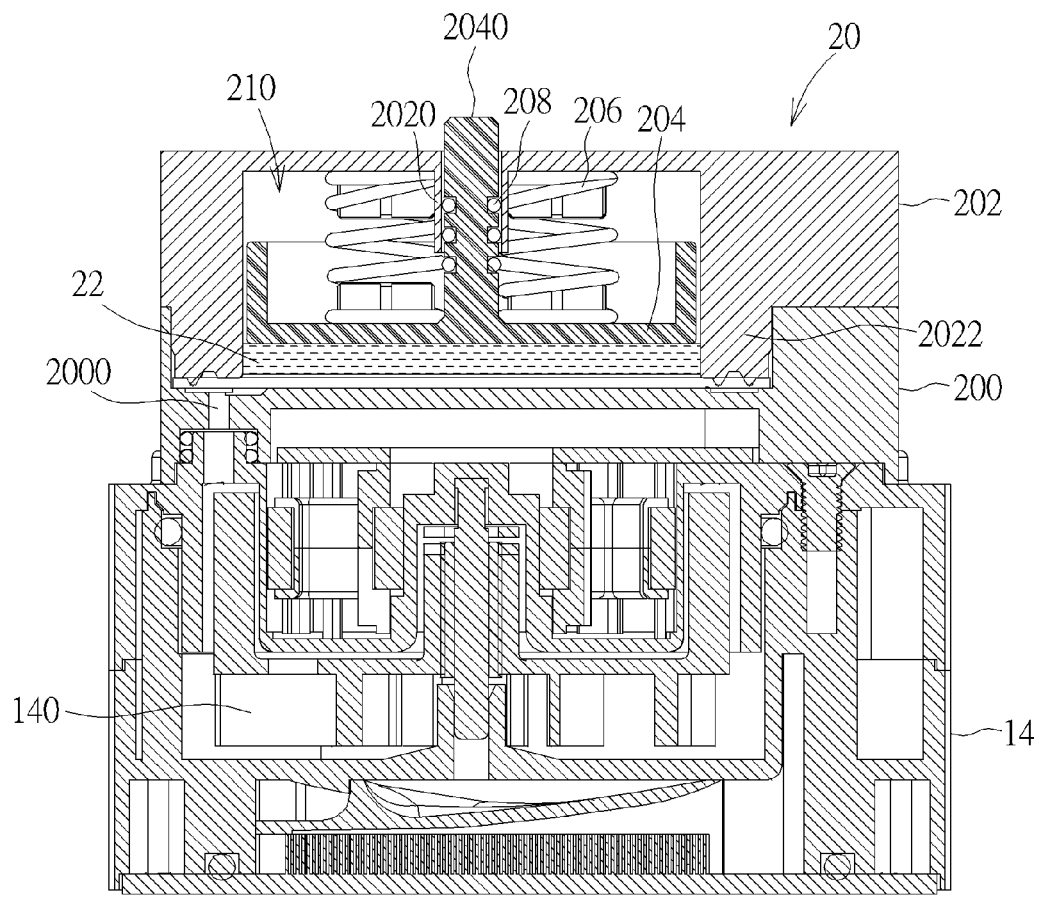
FIG. 5 is a cross-sectional view illustrating the plunger shown in FIG. 4 after being pushed by the resilient member.

Referring to FIGS. 1 to 5, FIG. 1 is a schematic view illustrating a liquid cooling system 1 according to an embodiment of the invention, FIG. 2 is a schematic view illustrating a liquid supply mechanism 20 connected to a pump 14, FIG. 3 is an exploded view illustrating the liquid supply mechanism 20, FIG. 4 is a cross-sectional view illustrating the liquid supply mechanism 20 and the pump 14, and FIG. 5 is a cross-sectional view illustrating the plunger 204 shown in FIG. 4 after being pushed by the resilient member 206.

As shown in FIG. 1, the liquid cooling system 1 comprises a liquid cooling head 10, a radiator 12, a pump 14, a liquid storage box 16 and a plurality of tubes 18. The tubes 18 are connected between the liquid cooling head 10, the radiator 12, the pump 14 and the liquid storage box 16 and used for transporting a cooling liquid between the liquid cooling head 10, the radiator 12, the pump 14 and the liquid storage box 16. The cooling liquid (not shown in FIG. 1) is filled in the liquid cooling head 10, the radiator 12, the pump 14, the liquid storage box 16 and the tubes 18. When the liquid cooling system 1 of the invention is used for dissipating heat from an electronic component (not shown), the liquid cooling head 10 of the liquid cooling system 1 is attached on the electronic component. The pump 14 transports the cooling liquid to the liquid cooling head 10, the cooling liquid absorbs the heat generated by the electronic component, and then the radiator 12 cools the cooling liquid. In practical applications, the cooling liquid may be water or other liquids.

As shown in FIGS. 2 to 5, the liquid cooling system 1 further comprises a liquid supply mechanism 20 connected to the pump 14. It should be noted that the liquid supply mechanism 20 is not limited to be connected to the pump 14. In another embodiment, the liquid supply mechanism 20 may also be connected to the liquid cooling head 10, the radiator 12, the liquid storage box 16 or the tube 18. In other words, the liquid supply mechanism 20 of the invention may be selectively connected to one of the liquid cooling head 10, the radiator 12, the pump 14, the liquid storage box 16 and the tubes 18 according to practical applications.

The liquid supply mechanism 20 comprises a lower cover 200, an upper cover 202, a plunger 204, at least one resilient member 206 and at least one damping member 208. The lower cover 200 has a liquid outlet 2000. The upper cover 202 is connected to the lower cover 200 and a chamber 210 is formed between the lower cover 200 and the upper cover 202. The chamber 210 communicates with the liquid outlet 2000 and contains a cooling liquid 22. The upper cover 202 has an axial hole 2020, wherein the axial hole 2020 is pillar-shaped. In this embodiment, the lower cover 200 has a connecting hole 2002 and the upper cover 202 has a ring-shaped wall 2022 surrounding the chamber 210, wherein the liquid outlet 2000 is located within the connecting hole 2002. When the upper cover 202 is connected to the lower cover 200, the ring-shaped wall 2022 of the upper cover 202 is connected to the connecting hole 2002 of the lower cover 200 tightly.

The plunger 204 is movably disposed in the chamber 210. The plunger 204 has an axial rod 2040 and the axial rod 2040 is inserted into the axial hole 2020. The resilient member 206 is disposed in the chamber 210. Opposite ends of the resilient member 206 abut against the upper cover 202 and the plunger 204. The damping member 208 is disposed on the axial rod 2040 and abuts against an inner wall of the axial hole 2020. In this embodiment, the resilient member 206 may be, but not limited to, a spring and the damping member 208 may be, but not limited to, an O-ring. Furthermore, the number of the resilient members 206 and the damping members 208 may be determined according to practical applications, so they are not limited to the embodiment shown in the figures.

In this embodiment, the lower cover 200 of the liquid supply mechanism 20 is connected to the pump 14, such that the liquid outlet 2000 communicates with the pump 14. The liquid outlet 2000 of the lower cover 200 is corresponding to a liquid inlet 140 of the pump 14 (as shown in FIGS. 4 and 5), such that the cooling liquid 22 within the chamber 210 can be injected into the pump 14 through the liquid outlet 2000 and the liquid inlet 140.

As shown in FIG. 4, when the liquid supply mechanism 20 is assembled completely and the chamber 210 contains the cooling liquid 22, the resilient member 206 is compressed. At this time, the resilient member 206 pushes the plunger 204 to move downward in the chamber 210 till the hydraulic pressure of the pump 14 balances. When the cooling liquid of the pump 14 reduces and then the hydraulic pressure reduces, the resilient member 206 of the liquid supply mechanism 20 will push the plunger 204 to move, so as to inject the cooling liquid 22 from the chamber 210 into the pump 14. In other words, the liquid supply mechanism 20 of the invention can supply the cooling liquid to the liquid cooling system 1 automatically when the cooling liquid is insufficient, so as to prevent the liquid cooling system 1 from being damaged due to insufficient cooling liquid. It should be noted that in addition to the resilient member 206, the invention may also replace the resilient member 206 by other mechanisms, which may generate normal force, shearing force, torque or magnetic force, to push the plunger 204 to move, so as to supply the cooling liquid.

Still further, the damping member 208 is disposed on the axial rod 2040 of the plunger 204 and abuts against an inner wall of the axial hole 2020 of the upper cover 202. When the plunger 204 is moving, a damping effect is generated between the damping member 208 and the inner wall of the axial hole 2020, so as to reduce the push force generated by the resilient member 206 for the plunger 204. As shown in FIG. 4, when the chamber 210 contains more cooling liquid 22, the resilient member 206 has larger amount of compression and more damping members 208 abut against the inner wall of the axial hole 2020. In other words, when the chamber 210 contains more cooling liquid 22, the push force generated by the resilient member 206 for the plunger 204 is larger and the invention uses more damping members 208 to provide larger damping effect, so as to reduce the push force generated by the resilient member 206 for the plunger 204. As shown in FIG. 5, when the chamber 210 contains less cooling liquid 22, the height of the plunger 204 reduces, the resilient member 206 has smaller amount of compression, and the number of damping members 208 abutting against the inner wall of the axial hole 2020 decrease. In other words, when the chamber 210 contains less cooling liquid 22, the push force generated by the resilient member 206 for the plunger 204 reduces and the invention uses less damping members 208 to provide smaller damping effect, so as to reduce the push force generated by the resilient member 206 for the plunger 204. Accordingly, the invention can adjust the damping effect according to the amount of the cooling liquid 22 within the chamber 210, so as to prevent the liquid cooling system 1 from generating high hydraulic pressure while supplying the cooling liquid to the liquid cooling system 1, such that the heat dissipating efficiency of the liquid cooling system 1 will not be affected.

Figure 6:
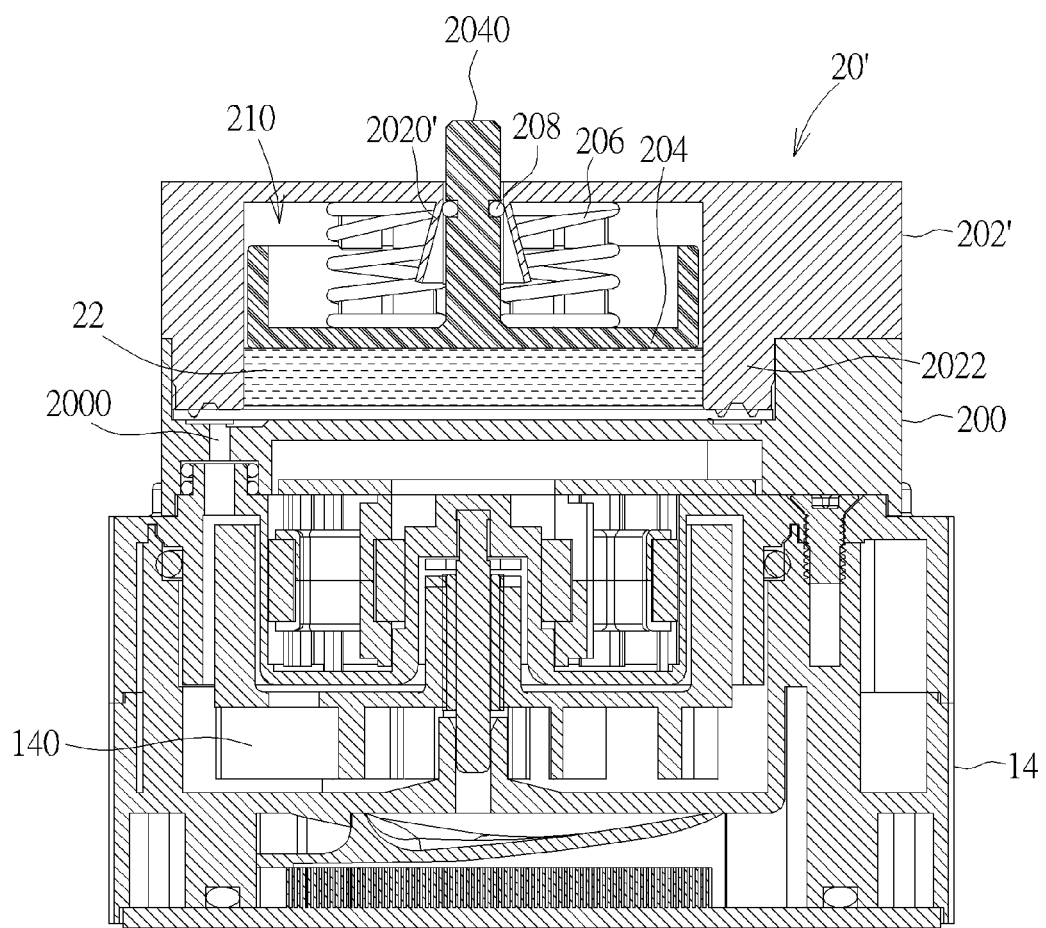
FIG. 6 is a cross-sectional view illustrating a liquid supply mechanism according to another embodiment of the invention.

Referring to FIG. 6, FIG. 6 is a cross-sectional view illustrating a liquid supply mechanism 20' according to another embodiment of the invention. The difference between the liquid supply mechanism 20' and the liquid supply mechanism 20 is that the axial hole 2020' of the upper cover 202' of the liquid supply mechanism 20' is taper-shaped and the liquid supply mechanism 20' has one single damping member 208, as shown in FIG. 6. When the resilient member 206 pushes the plunger 204 to move downward, the contact force between the damping member 208 and the inner wall of the axial hole 2020' will reduce since the axial hole 2020' is taper-shaped. Accordingly, the invention can adjust the damping effect according to the amount of the cooling liquid 22 within the chamber 210. It should be noted that the same elements in FIG. 6 and FIG. 4 are represented by the same numerals, so the repeated explanation will not be depicted herein again.

Figure 7:
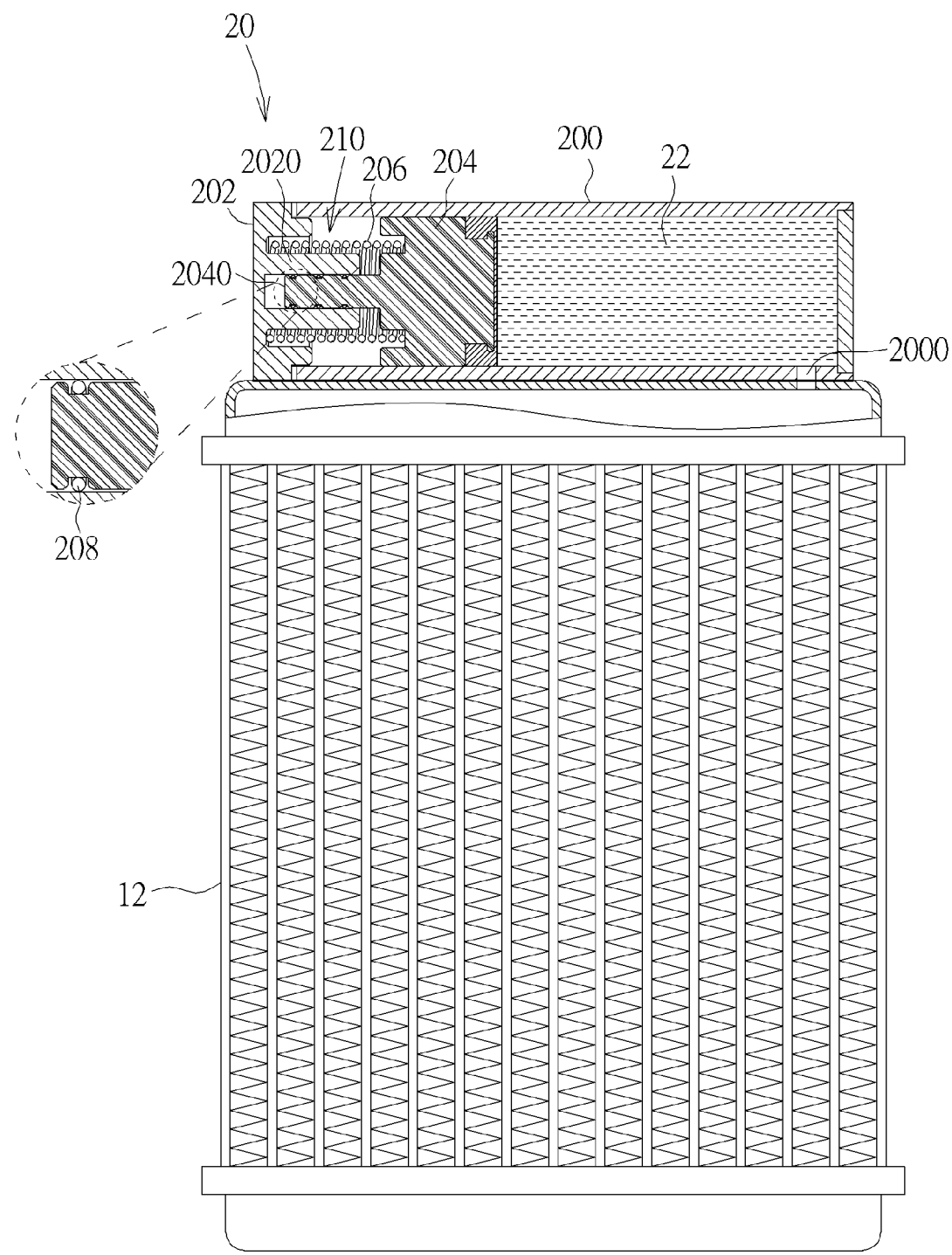
FIG. 7 is a cross-sectional view illustrating the liquid supply mechanism and the radiator according to another embodiment of the invention.

Referring to FIG. 7, FIG. 7 is a cross-sectional view illustrating the liquid supply mechanism 20 and the radiator 12 according to another embodiment of the invention. As shown in FIG. 7, the liquid supply mechanism 20 may be connected to the radiator 12, such that the liquid outlet 2000 communicates with the radiator 12. Accordingly, when the cooling liquid of the radiator 12 reduces and then the hydraulic pressure reduces, the resilient member 206 of the liquid supply mechanism 20 will push the plunger 204 to move, so as to inject the cooling liquid 22 from the chamber 210 into the radiator 12. It should be noted that the same elements in FIG. 7 and FIG. 4 are represented by the same numerals, so the repeated explanation will not be depicted herein again.

As mentioned in the above, the liquid supply mechanism of the invention is selectively connected to one of the liquid cooling head, the radiator, the pump, the liquid storage box and the tubes. When the cooling liquid reduces and then the hydraulic pressure of the liquid cooling system reduces, the resilient member of the liquid supply mechanism will push the plunger to move, so as to inject the cooling liquid from the chamber into the liquid cooling system. In other words, the liquid supply mechanism of the invention can supply the cooling liquid to the liquid cooling system automatically when the cooling liquid is insufficient, so as to prevent the liquid cooling system from being damaged due to insufficient cooling liquid. Furthermore, the damping member is disposed on the axial rod of the plunger and abuts against the inner wall of the axial hole. When the plunger is moving, a damping effect is generated between the damping member and the inner wall of the axial hole, so as to reduce the push force generated by the resilient member for the plunger. Accordingly, the invention can prevent the liquid cooling system from generating high hydraulic pressure while supplying the cooling liquid to the liquid cooling system, such that the heat dissipating efficiency of the liquid cooling system will not be affected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A liquid supply mechanism comprising:
   a lower cover having a liquid outlet;
   an upper cover connected to the lower cover, a chamber being formed between the lower cover and the upper cover, the chamber communicating with the liquid outlet, the upper cover having an axial hole;
   a plunger movably disposed in the chamber, the plunger having an axial rod, the axial rod being inserted into the axial hole;
   at least one resilient member disposed in the chamber, opposite ends of the resilient member abutting against the upper cover and the plunger; and
   a plurality of damping members disposed on the axial rod, wherein a number of the damping members abutting against an inner wall of the axial hole changes in response to a height of the plunger.

2. The liquid supply mechanism of claim 1, wherein the damping member is an O-ring.

3. The liquid supply mechanism of claim 1, wherein the axial hole is pillar-shaped.

4. The liquid supply mechanism of claim 1, wherein the lower cover has a connecting hole, the upper cover has a ring-shaped wall surrounding the chamber, and the ring-shaped wall is connected to the connecting hole tightly.

5. The liquid supply mechanism of claim 4, wherein the liquid outlet is located within the connecting hole.

6. A liquid cooling system comprising:
   a liquid cooling head;
   a radiator;
   a pump;
   a liquid storage box;
   a plurality of tubes connected between the liquid cooling head, the radiator, the pump and the liquid storage box; and
   a liquid supply mechanism selectively connected to one of the liquid cooling head, the radiator, the pump, the liquid storage box and the tubes, the liquid supply mechanism comprising:
     a lower cover having a liquid outlet;
     an upper cover connected to the lower cover, a chamber being formed between the lower cover and the upper cover, the chamber communicating with the liquid outlet, the upper cover having an axial hole;
     a plunger movably disposed in the chamber, the plunger having an axial rod, the axial rod being inserted into the axial hole;
     at least one resilient member disposed in the chamber, opposite ends of the resilient member abutting against the upper cover and the plunger; and
     a plurality of damping members disposed on the axial wherein a number of the damping members abutting against an inner wall of the axial hole changes in response to a height of the plunger.

7. The liquid cooling system of claim 6, wherein the damping member is an O-ring.

8. The liquid cooling system of claim 6, wherein the axial hole is pillar-shaped.

9. The liquid cooling system of claim 6, wherein the lower cover has a connecting hole, the upper cover has a ring-shaped wall surrounding the chamber, and the ring-shaped wall is connected to the connecting hole tightly.

10. The liquid cooling system of claim 9, wherein the liquid outlet is located within the connecting hole.

* * * * *